United States Patent
Yu et al.

(10) Patent No.: US 11,380,869 B2
(45) Date of Patent: Jul. 5, 2022

(54) DISPLAY PANEL, METHOD OF MANUFACTURING THE SAME, AND DISPLAY APPARATUS

(71) Applicants: Wuhan Tianma Micro-Electronics Co., Ltd., Wuhan (CN); Wuhan Tianma Microelectronics Co., Ltd. Shanghai Branch, Shanghai (CN)

(72) Inventors: Quanpeng Yu, Shanghai (CN); Zhe Li, Shanghai (CN)

(73) Assignees: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 0 days.

(21) Appl. No.: 16/716,389

(22) Filed: Dec. 16, 2019

(65) Prior Publication Data
US 2021/0066650 A1  Mar. 4, 2021

(30) Foreign Application Priority Data
Aug. 30, 2019  (CN) .......................... 201910817020.0

(51) Int. Cl.
*H01L 51/52*  (2006.01)
*H01L 51/56*  (2006.01)

(52) U.S. Cl.
CPC .......... *H01L 51/5253* (2013.01); *H01L 51/56* (2013.01); *H01L 2251/301* (2013.01)

(58) Field of Classification Search
CPC ............. H01L 51/5253; H01L 27/3258; H01L 2251/301; H01L 27/3244; H01L 51/5237
See application file for complete search history.

(56) References Cited

U.S. PATENT DOCUMENTS

2019/0095007 A1\* 3/2019 Jeong ..................... G06F 3/0446
2020/0013971 A1\* 1/2020 Park .......................... B32B 3/04

FOREIGN PATENT DOCUMENTS

CN  108417608 A  8/2018
CN  109560109 A  4/2019
(Continued)

OTHER PUBLICATIONS

First Chinese Office Action, dated Apr. 12, 2021, issued in Chinese Application No. 201910817020.0, filed Aug. 30, 2019, 22 pages.
(Continued)

*Primary Examiner* — Fernando L Toledo
*Assistant Examiner* — Valerie N Newton
(74) *Attorney, Agent, or Firm* — Christensen O'Connor Johnson Kindness PLLC

(57) ABSTRACT

The present disclosure provides a display panel including: a substrate; an array layer located on the substrate and including a first inorganic insulating layer, and the first inorganic insulating layer including a first recess in the non-display area; a light-emitting function layer located on the array layer; a thin film encapsulation layer on the light-emitting function layer; and an organic auxiliary layer filled in the first recess. The thin film encapsulation layer includes at least one inorganic encapsulation layer covering the display area and extending to contact and cover the organic auxiliary layer in the first recess; and the at least one inorganic encapsulation layer includes a first opening located on the organic auxiliary layer in the recess. The present disclosure further provides a method of manufacturing the display panel and a display apparatus including the display panel.

18 Claims, 13 Drawing Sheets

(56) References Cited

FOREIGN PATENT DOCUMENTS

CN 109638019 A 4/2019
CN 110120465 A 8/2019

OTHER PUBLICATIONS

Second Office Action dated Oct. 21, 2021, in Chinese Patent Application No. 201910817020.0, 16 pages. (With English translation).

* cited by examiner

DISPLAY PANEL, METHOD OF MANUFACTURING THE SAME, AND DISPLAY APPARATUS

CROSS-REFERENCE TO RELATED APPLICATIONS

The present application claims priority to Chinese Patent Application No. 201910817020.0 filed on Aug. 30, 2019, the content of which is incorporated herein by reference in its entirety.

TECHNICAL FIELD

The present disclosure relates to the field of display technologies, and in particular, to a display panel, a method of manufacturing the display panel, and a display apparatus including the display panel.

BACKGROUND

The technologies of manufacturing display panels have advanced with the continuous development of display technologies. On the one hand, however, the display panel has a relatively fragile edge, collisions more frequently occur on the edge, and stress concentration is more likely to occur, and thus cracks may occur at the edge. On the other hand, in a manufacturing process of the display panel, multiple display panels are manufactured simultaneously in one mother panel. Next, the mother panel is cut to form multiple separate display panels after the manufacturing process is finished. At the time of cutting, the current techniques include mechanical cutting and laser cutting. The mechanical cutting, due to the pressure applied by the cutter head on the panel, may result in a cracking of a thin film encapsulation layer from the edge, while the laser cutting method may also lead to cracks due to thermal effect. Thus formed cracks can form paths for water vapor and oxygen penetration from the side edge. In addition, cutting stress also causes certain damage to display layer devices and thin film encapsulation layer.

SUMMARY OF THE INVENTION

In view of the above, the present disclosure provides a display panel having a display area and a non-display area surrounding the display area, the display panel includes a substrate; an array layer located on the substrate, wherein the array layer includes a first inorganic insulating layer, and the first inorganic insulating layer includes a first recess located in the non-display area; a light-emitting function layer located on the array layer; a thin film encapsulation layer located on the light-emitting function layer; and an organic auxiliary layer, the organic auxiliary layer being filled in the first recess. The thin film encapsulation layer includes an inorganic encapsulation layer covering the display area and extending to contact and cover the organic auxiliary layer in the first recess. The at least one inorganic encapsulation layer includes a first opening penetrating through the at least one inorganic encapsulation layer, and the first opening is located on the organic auxiliary layer in the first recess.

The present disclosure also provides a method of manufacturing a display panel having a display area and a non-display area surrounding the display area. The method includes: providing a substrate; manufacturing an array layer on one side of the substrate, wherein said manufacturing the array layer includes manufacturing a first inorganic insulating layer, the first inorganic insulating layer including a first recess in the non-display area; manufacturing a light-emitting function layer on a side of the array layer facing away from the substrate; manufacturing a thin film encapsulation layer on a side of the light-emitting function layer facing away from the substrate; manufacturing an organic auxiliary layer after the first inorganic insulating layer is manufactured, the organic auxiliary layer being filled in the first recess, in which said manufacturing the thin film encapsulation layer includes: manufacturing at least one inorganic encapsulation layer covering the display area and extending to contact and cover the organic auxiliary layer in the at least one first recess; and forming, in the at least one inorganic encapsulation layer, a first opening penetrating through the at least one inorganic encapsulation layer, the first opening is located on the organic auxiliary layer in the first recess.

The present disclosure also provides a display apparatus including the above display panel.

DESCRIPTION OF EMBODIMENTS

Figure 1:
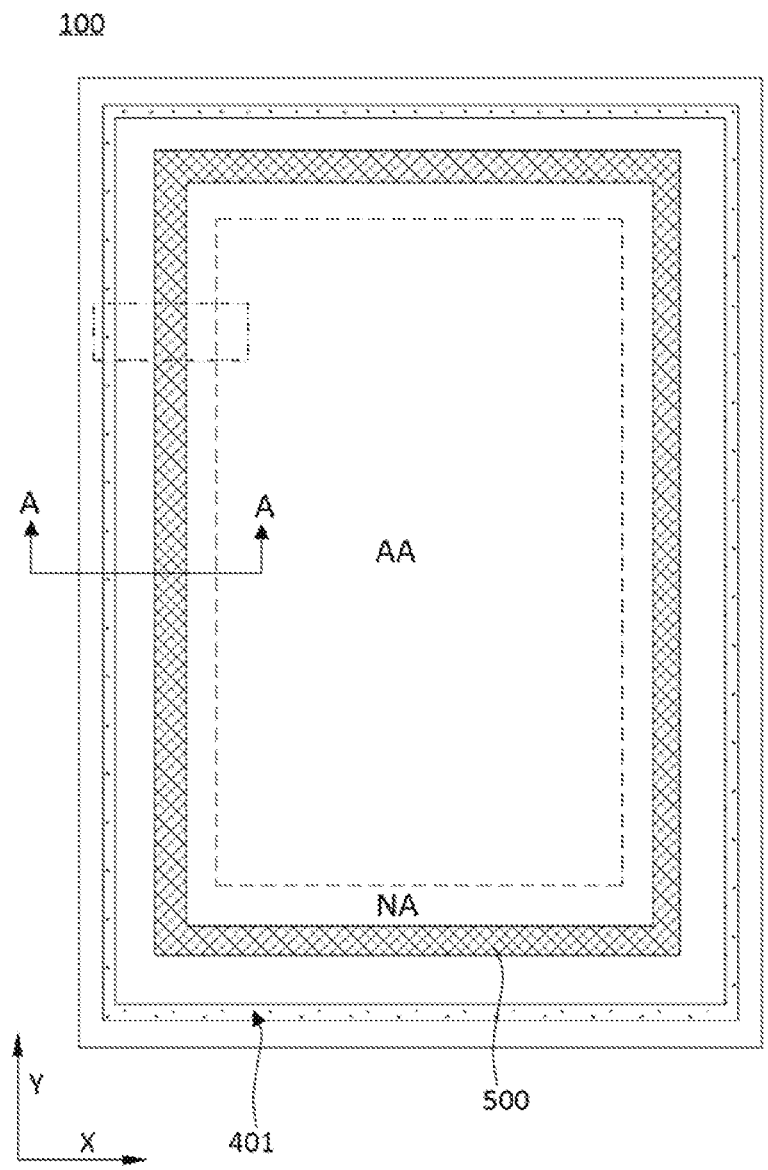
FIG. 1 is a top view of a display panel according to an embodiment of the present disclosure.

In order to better understand the above described objects, features and advantages of the present disclosure, the present disclosure will be further illustrated by referring to the embodiments and accompanying drawings.

It is to be noted that specific details are set forth in the following description in order to fully understand the present disclosure. However, the present disclosure can be implemented in a variety of ways other than those described herein, and those skilled in the art can make similar developments. The present disclosure is therefore not limited to the specific embodiments disclosed below.

The terms used in the embodiments of the present disclosure are only for the purpose of describing particular embodiments and are not intended to limit the present disclosure. The singular forms "a", "the" and "said" used in the embodiments and the appended claims are also intended to include plural forms thereof, unless otherwise indicated in the context.

It should be noted that orientation terms "upper", "lower", "left", "right" and the like described in the embodiments of the present disclosure are described in view of a specific figure, and should not be construed as limitations to the embodiments of the present disclosure. In addition, in the context, it should also be understood that when an element is referred to as being formed "above" or "under" another element, it not only can be directly formed "above" or "under" another element, but also can be indirectly formed "above" or "under" another element via an intermediate element.

The present disclosure is described in detail with reference to drawings and embodiments as below, in order to clearly explain the above objects, features and advantages. The illustrated embodiments can be implemented in a variety of forms and the present disclosure is not limited to the embodiments set forth herein; rather, these embodiments are provided to more comprehensively and completely convey the concept of the embodiments to those skilled in the art. The identical reference numerals in the drawings denote the same or similar structures, and a repetitive description thereof is omitted. The words indicating positions and orientations in the present disclosure are described in view of the drawings, which can also change when necessary, and the modifications are included in the scope of the present disclosure. The drawings of the present disclosure are only used to illustrate relative positional relationships, layer thicknesses of some portions are drawn in an exaggerated way in order to facilitate understanding, and the layer thicknesses in the drawings do not represent a proportional relationship of actual layer thicknesses. In the case of no conflict, the embodiments of the present disclosure and the features in the embodiments can be combined with each other. The reference signs are consistent in all drawings of the various embodiments of the present disclosure. In addition, the same features of different embodiments are not repeated.

Figure 2:
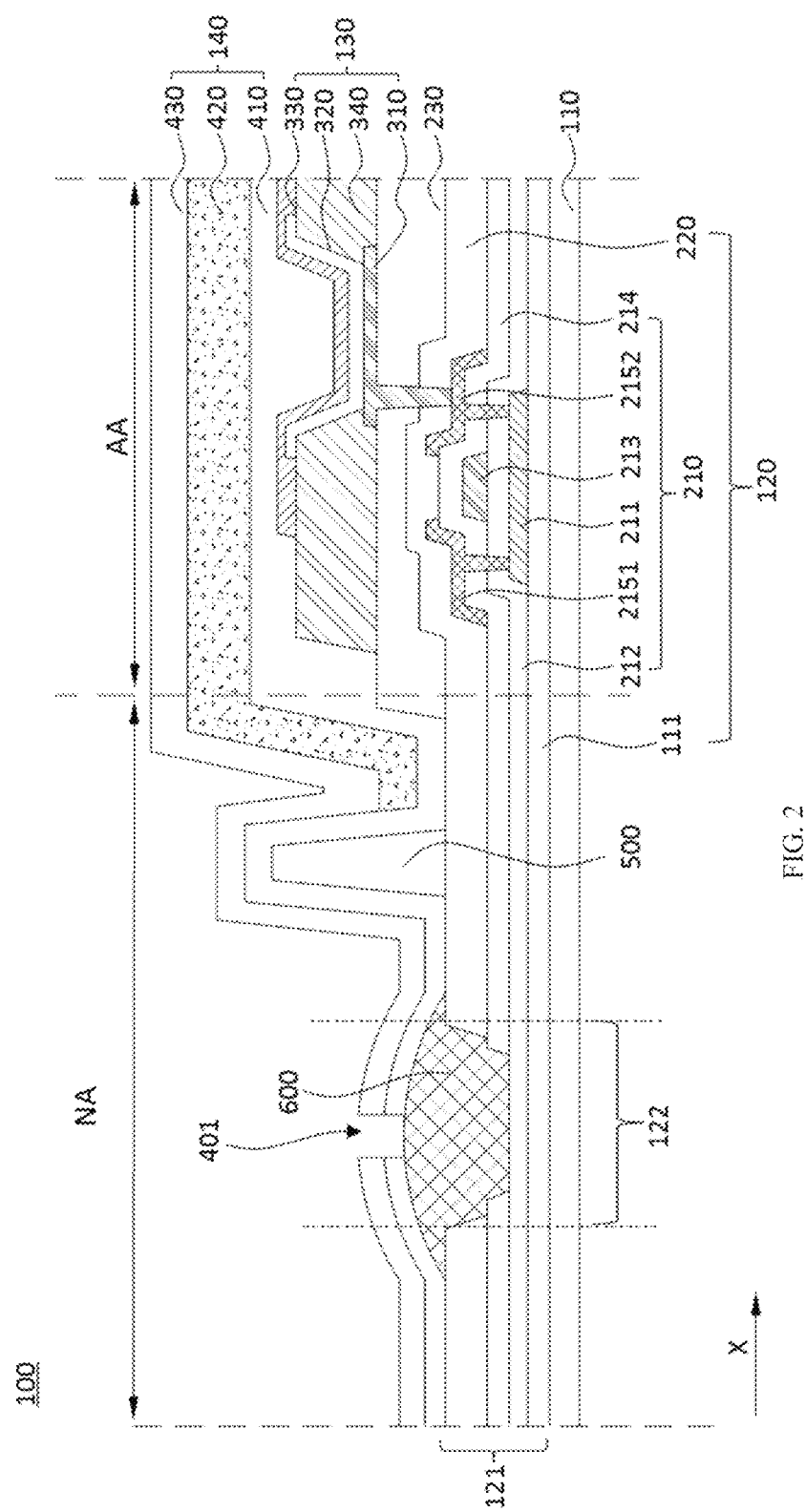
FIG. 2 is a cross-sectional view taken along A-A of FIG. 1.
Figure 3:
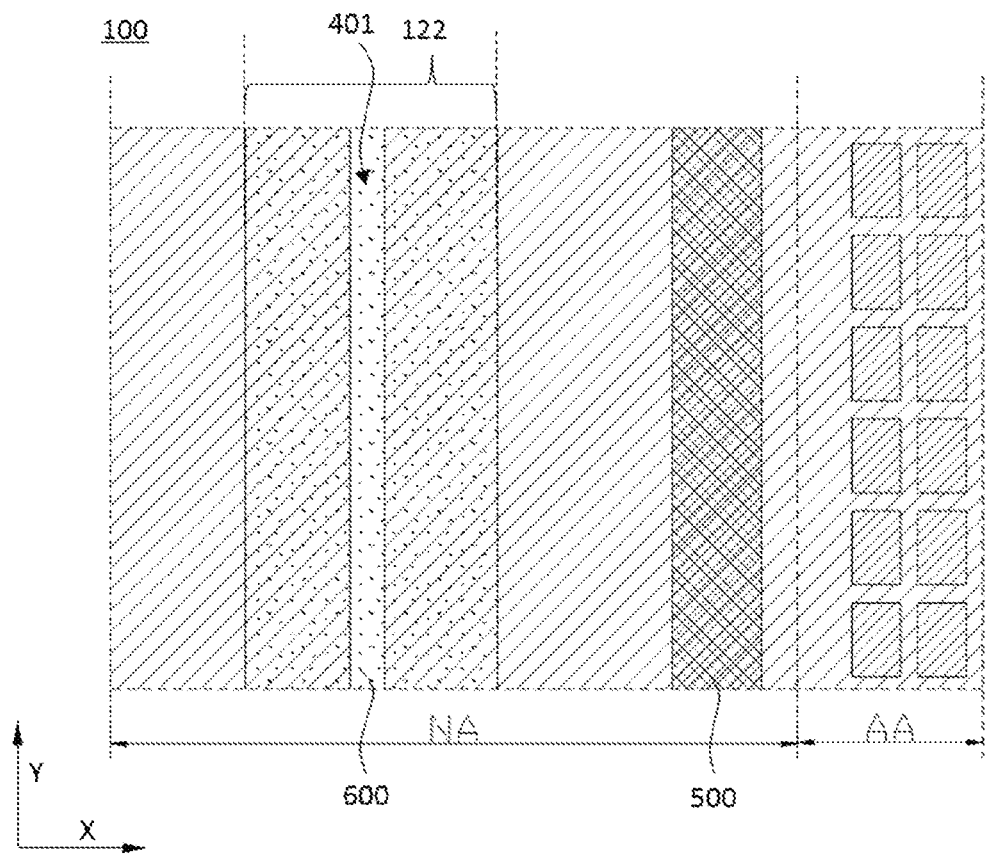
FIG. 3 is a schematic enlarged view of a dotted line box shown in FIG. 1.

FIG. 1 is a top view of a display panel according to an embodiment of the present disclosure, FIG. 2 is a cross-sectional view taken along A-A of FIG. 1, in which the cross section is perpendicular to a plane of the display panel and parallel with a direction in which a display area of the display panel points towards a non-display area of the display panel (or the cross section is perpendicular to the plane of the display panel and perpendicular to an extending direction of an edge of the display panel edge in the top view), and FIG. 3 is an enlarged view of dotted line box of FIG. 1.

In an embodiment, the display panel 100 is divided into a display area AA and a non-display area NA surrounding the display area AA. It can be understood that the dashed box in FIG. 1 indicates a boundary between the display area AA and the non-display area NA. The display area AA is an area of the display panel for displaying an image, and generally includes a plurality of pixel units arranged in an array. Each of the pixel units includes a respective light-emitting device such as an organic light-emitting diode, and a respective control element such as a thin film transistor that constitutes a pixel driving circuit. The non-display area NA surrounds the display area AA and generally includes peripheral driving elements, peripheral wirings, and fan-out areas.

In an embodiment, the display panel 100 includes, sequentially arranged, a substrate 110, an array layer 120, a light-emitting function layer 130, and a thin film encapsulation layer 140.

The substrate 110 can be made of a polymer, for example, glass, polyimide (PI), polycarbonate (PC), polyethersulfone (PES), polyethylene glycol terephthalate (PET), polyethylene glycol naphthalene dicarboxylate (PEN), polyarylate (PAR), or glass fiber reinforced plastic (FRP). The substrate 110 can be transparent, translucent or opaque.

The array layer 120 is arranged on the substrate 110.

In an embodiment, the array layer 120 includes a plurality of thin film transistors (TFTs) 210. The plurality of thin film transistors constitutes pixel circuits for controlling light-emitting devices.

In the embodiments of the present disclosure, the thin film transistor of a top gate type is an example for structural description. The thin film transistor layer 210 includes: an active layer 211 located on the substrate 110. The active layer 211 can be made of an amorphous silicon material, a polysilicon material, a metal oxide material, or the like. The active layer 211 can include a source region and a drain region that are formed by doping N-type or P-type impurity ions, and a channel region between the source region and the drain region.

A gate insulating layer 212 is provided on the active layer 211. The gate insulating layer 212 can include an inorganic layer of silicon oxide or silicon nitride, and can be a single layer or multiple layers.

A gate electrode 213 is provided on the gate insulating layer 212. The gate electrode 213 can include one or more layers of gold (Au), silver (Ag), copper (Cu), nickel (Ni), platinum (Pt), palladium (Pd), aluminum (Al), molybdenum (MO), or chromium (Cr), or an alloy, for example, aluminum (Al): niobium (Nd) alloy, and molybdenum (MO): tungsten (W) alloy.

An interlayer insulating layer 214 may be provided on the gate electrode 213. The interlayer insulating layer 214 can be formed of an inorganic insulating layer of, for example, silicon oxide or silicon nitride. In other embodiments of the present disclosure, the interlayer insulating layer can be formed of an organic insulating material.

A source electrode 2151 and a drain electrode 2152 are provided on the interlayer insulating layer 214. The source electrode 2151 and the drain electrode 2152 are electrically connected (or bonded) to the source region and the drain region through contact holes, respectively. The contact holes can be formed by partially removing the gate insulating layer 212 and the interlayer insulating layer 214.

It can be understood that one film layer being located or provided "on" another film layer in the embodiments can be interpreted as being located or provided on a side of another film layer facing away from the substrate.

In an embodiment, the array layer 120 can further include a buffer layer 111 located on a side surface of the array layer 120 in contact with the substrate 110. However, in some embodiments, the buffer layer 111 is a part of the substrate 110.

In an embodiment, the buffer layer 111 has a layered structure including inorganic layers and inorganic layers for blocking oxygen and moisture, thereby preventing moisture or impurities from diffusing through the substrate, and providing a flat surface on an upper surface of the substrate 110, the specific structure thereof is not repeated herein.

In an embodiment, the array layer 120 further includes a passivation layer 220 located on the thin film transistor layer 210. The passivation layer 220 can be formed of an inorganic layer of silicon oxide, silicon nitride or the like, or formed of an organic layer.

In an embodiment, the array layer 120 selectively includes a first inorganic insulating layer 121. In an embodiment, the first inorganic insulating layer 121 covers at least the non-display area NA; and the first inorganic insulating layer 121 includes a recess 122 located in the non-display area NA. At least one opening of the recess 122 is located on a side surface of the array layer 120 facing away from the substrate 110.

In an embodiment, the buffer layer, the gate insulating layer, the interlayer insulating layer, and the passivation layer extend from the display area to the non-display area, and even to a cutting edge of the display panel. The first inorganic insulating layer can be a combination of one or more of the buffer layer, the gate insulating layer, the interlayer insulating layer, and the passivation layer.

In an embodiment, the first inorganic insulating layer 121 at least includes the interlayer insulating layer 214 and the passivation layer 220; and the first recess 122 is located in the non-display area NA, such that it penetrates through the interlayer insulating layer 214 and the passivation layer 220.

In an embodiment, the display panel 100 further includes a planarization layer 230 located on the array layer 120, and an anode 310. The anode 310 includes an organic layer such as acryl, polyimide (PI), or benzocyclobutene (BCB), and the planarization layer 230 has a planarization effect.

The light-emitting function layer 130 is located on the side surface of the array layer 120 facing away from the substrate 110.

In an embodiment, the light-emitting function layer 130 includes an organic light-emitting device. The organic light-emitting device includes an anode 310, an organic light-emitting material 320, and a cathode 330 that are sequentially disposed in a direction facing away from the substrate 110. The anode 310 includes anode patterns corresponding to the pixel units in one-to-one correspondence, and each anode pattern in the anode 310 is connected to the source electrode 2151 or the drain electrode 2152 of the thin film transistor 210 through a through-hole in the anode 310.

The light-emitting function layer 130 further includes a pixel definition layer 340 located on a side of the anode layer 310 facing away from the array layer 200. The pixel definition layer 340 can be formed of an organic material such as polyimide (PI), polyamide, benzocyclobutene (BCB), acryl resin, or phenolic resin, or an inorganic material such as SiNx.

In an embodiment, an opening of the pixel definition layer 340 defines an organic light-emitting device located in the display area AA. The pixel definition layer 340 includes a plurality of openings that expose the anode 310, and the pixel definition layer 340 covers edges of the patterns of the anode 310. The organic light-emitting material 320 is at least partially filled in the openings of the pixel definition layer 340 and is in contact with the anode 310. The organic light-emitting material 320 in each of the openings of the pixel definition layer 340 forms a light-emitting unit. Each light-emitting unit can emit light of a different color according to the different organic light-emitting materials 320. Each light-emitting unit and the pixel circuit together form a pixel, and the plurality of pixels together functions to display images.

In other embodiments, the organic light-emitting device is a light-emitting diode (LED) or other self-illuminating device, or the organic light-emitting device is a device for displaying images based on other principles.

The display panel 100 may further include an organic auxiliary layer 600 located on the side of the array layer 120 facing away from the substrate 110. The first recess 122 is filled with the organic auxiliary layer 600.

In an embodiment, the organic auxiliary layer 600 can be formed of the same material and located in the same layer as one or more of the planarization layer 230 and the pixel definition layer 340 that are located between the array layer 120 and the light-emitting function layer 130. In this way, the manufacturing process is simplified and the introduction of new layer materials is avoided.

In an embodiment, the planarization layer 230 and the pixel definition layer 340 are encapsulated by the thin film encapsulation layer 140. Therefore, the planarization layer 230 and the organic auxiliary layer 600 are not connected to each other, and the pixel definition layer 340 and the organic auxiliary layer 600 are not connected to each other.

In an embodiment, the display panel 100 further includes a thin film encapsulation layer 140 (TFE) located on the light-emitting function layer 130, i.e., on a side of the light-emitting function layer 130 facing away from the array layer 120, and completely covering the light-emitting function layer 130 in order to seal the light-emitting function layer 130.

In an embodiment, the thin film encapsulation layer 140 includes at least one inorganic encapsulation layer. For example, the thin film encapsulation layer 140 is disposed on the cathode layer 330, and includes a first inorganic encapsulation layer 410, a first organic encapsulation layer 420, and a second inorganic encapsulation layer 430 that are sequentially disposed in a direction facing away from the substrate 110.

In other optional embodiments, the thin film encapsulation layer 140 can include any number of stacked layers of organic materials and inorganic materials according to the requirements, as long as the stack includes at least one layer of an organic material and at least one layer of an inorganic material that are alternately deposited, and as long as the stack has both a lowermost layer and an uppermost layer made of the inorganic material.

In an embodiment, the first inorganic encapsulation layer 410 and the second inorganic encapsulation layer 430 cover the display area AA, and extend from the display area AA to the non-display area NA, even to the cutting edge of the display panel 100. The first inorganic encapsulation layer 410 and the second inorganic encapsulation layer 430 cover the first recess 122, and the first inorganic encapsulation layer 410 is in contact with the organic auxiliary layer 600 in the first recess 122. Moreover, a first opening 401 is formed in and penetrates through the first inorganic encapsulation layer 410 and the second inorganic encapsulation layer 430 in the non-display area. The first opening 401 is located on the organic auxiliary layer 600 in the first recess 122. That is, along a direction perpendicular to the display panel 100, a projection of the first opening 401 on the substrate 110 is located within a projection of the first recess 122 on the substrate 110, and the projection of the first opening 401 on the substrate 110 is located within a projection of the organic auxiliary layer 600 on the substrate 110.

In an embodiment, the inorganic encapsulation layers in the non-display area NA are in direct contact with the first inorganic insulating layer 121 at least at two sides of the first recess 122 in a first direction X. The first direction X is parallel to the cross-section of FIG. 2 (or parallel to the direction in which the display area AA points towards the non-display area NA) and is parallel to the plane of the display panel 100.

It is merely an example that both inorganic encapsulation layers, i.e., both the first inorganic encapsulation layer 410 and the second inorganic encapsulation layer 430, extend to the non-display area. In other embodiments of the present disclosure, more encapsulation layers extend to the non-display area and meanwhile are provided with a first opening, or only one inorganic encapsulation layer extends to, contacts with and covers the organic auxiliary layer in the first recess.

In the present embodiment, the first recess is provided and is filled with an organic material. On the one hand, the first recess can prevent the crack at the cutting edge from spreading to the display area, and the organic auxiliary layer can also block the crack while relieving the stress; on the other hand, with such a design, in combination with the thin film encapsulation layer, the film layer contacting the lower side of the film encapsulation layer changes from an inorganic material to an organic material, and then to another inorganic material along a direction in which the crack may spread (i.e., a direction from the edge of the display panel points towards the display area). Since CTE values of the first inorganic insulating layer and the inorganic encapsulating layer are different from a CTE value of the organic auxiliary layer, and expansion ratios of the inorganic encapsulating layer and the first inorganic insulating layer are different from an expansion ratio of the organic auxiliary layer, different degrees of thermal expansion and contraction may occur under the same temperature change. Therefore, the inorganic encapsulation layer is formed with an opening facing the organic auxiliary layer in the first recess, i.e., the first opening. It should be understood that, as the temperature may change during subsequent manufacturing processes such as curing, laser removal, etc., the first opening can be formed in the above structure without additional manufacturing process.

Moreover, the crack at the edge of the display panel can be prevented from spreading to the display area by the first opening, and the organic material can alleviate the stress at an edge of the opening of the inorganic encapsulation layer located on the organic auxiliary layer, thereby preventing the spreading of the crack at the edge of the display panel and reducing a risk of cracking in non-edge areas of the display panel. In addition, since the organic auxiliary layer is received in the first recess, an increase in the film thickness is avoided.

Further referring to FIGS. 1 and 2, the organic auxiliary layer 600 completely fills the first recess 122 and contacts a bottom and sidewalls of the first recess 122 while covering an opening edge of the first recess 122. That is, the organic auxiliary layer 600 also covers the boundary between the first recess 122 and a non-recess area of the first inorganic insulating layer 121.

In this way, a detachment of the organic auxiliary layer from the first inorganic insulating layer can be avoided, which is caused by different thermal expansion and contraction, bending, stretching or compressing.

In an embodiment, the display panel 100 further includes a retaining wall 500 disposed in the non-display area NA. The retaining wall 500 may be disposed on the passivation layer 220, for example, between the passivation layer 220 and the thin film encapsulation layer 140. An orthographic projection of the retaining wall 500 on the substrate 110 (i.e., a projection along a direction perpendicular to the substrate) surrounds the planarization layer 230. That is, an edge of an orthographic projection of the planarization layer 230 on the substrate 110 is located on a side of the retaining wall 500 adjacent to the display area AA. The first inorganic encapsulating layer 410 is located within a region defined by the retaining wall 500, and the organic material in the thin film encapsulation layer 140 is prevented from overflowing by the retaining wall 500.

Further, an orthographic projection of the first recess 122 on the substrate 110 (i.e., a projection along a direction perpendicular to the substrate) surrounds the retaining wall 500. The first opening 401 surrounds the display area AA, and the first opening 401 also surrounds the retaining wall 500. In other words, the inorganic encapsulation layer (i.e., a continuous inorganic encapsulation layer) having an encapsulation function stops at a side edge of the first opening 401 close to the display area AA. Moreover, an orthographic projection of the side edge on the substrate 110 falls within the orthographic projection of the organic auxiliary layer 600 on the substrate 110.

In this way, in this embodiment, due to the design of the organic auxiliary layer and the first recess, the first opening can be formed, and the crack at the display edge can be blocked by the first opening without providing more retaining walls to block the inorganic encapsulation layer, therefore facilitating a narrow frame of the display panel. In addition, it is unnecessary to additionally form a patterned edge of the inorganic encapsulation layer.

In an embodiment, the first recess 122 has a width ranging from 3 µm to 10 µm. Since the organic light-emitting device is more sensitive to temperature, a change of the ambient temperature during the manufacturing process of the display panel is limited. The inventors have found that, when the width of the first recess 122 ranges from 3 µm to 10 µm, a difference in thermal expansion and contraction between the inorganic encapsulating layer and the organic auxiliary layer is sufficient to form the first opening 401 in the inorganic encapsulating layer within a tolerable range of temperature change of the display panel.

It can be understood that, in this embodiment, the width of the first recess at a certain position refers to a dimension at this position in a direction from the display area adjacent to this first recess towards the edge of the display panel adjacent to this first recess, which is also simply referred as the direction from the display area towards the edge of the display panel i.e., a dimension in the first direction X.

Figure 4:
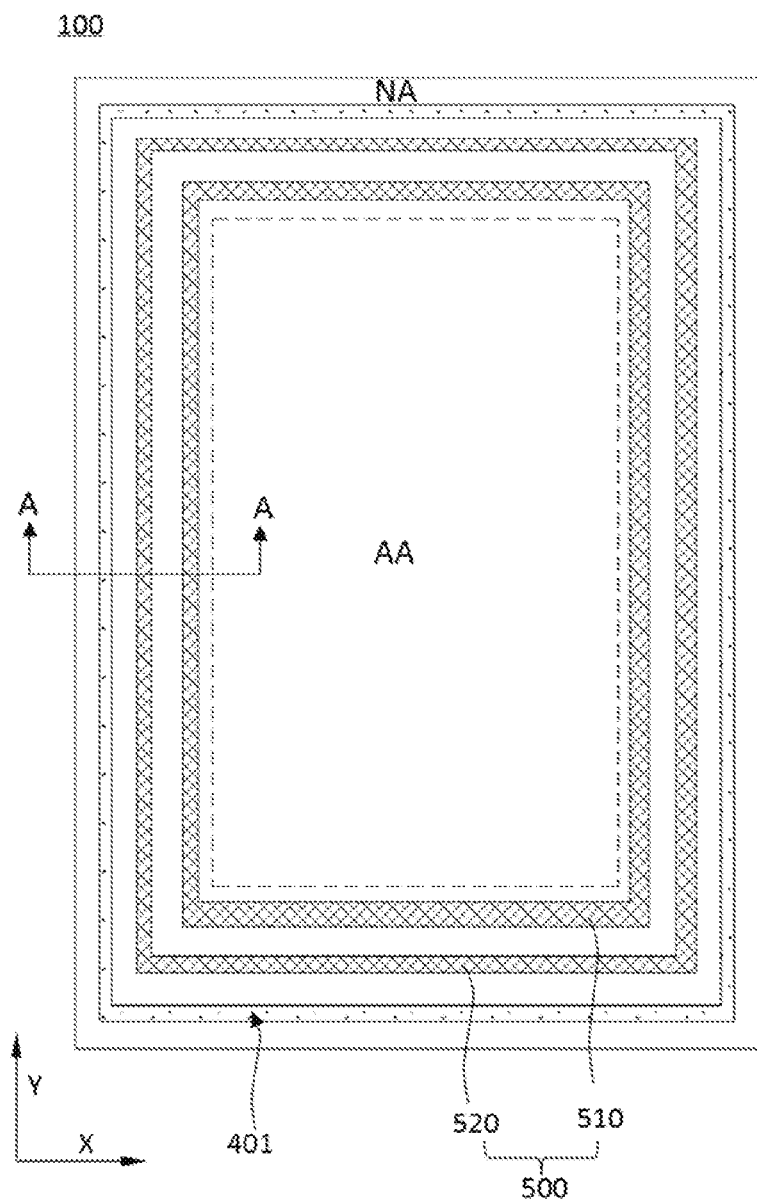
FIG. 4 is a schematic diagram of a display panel according to another embodiment of the present disclosure.
Figure 5:
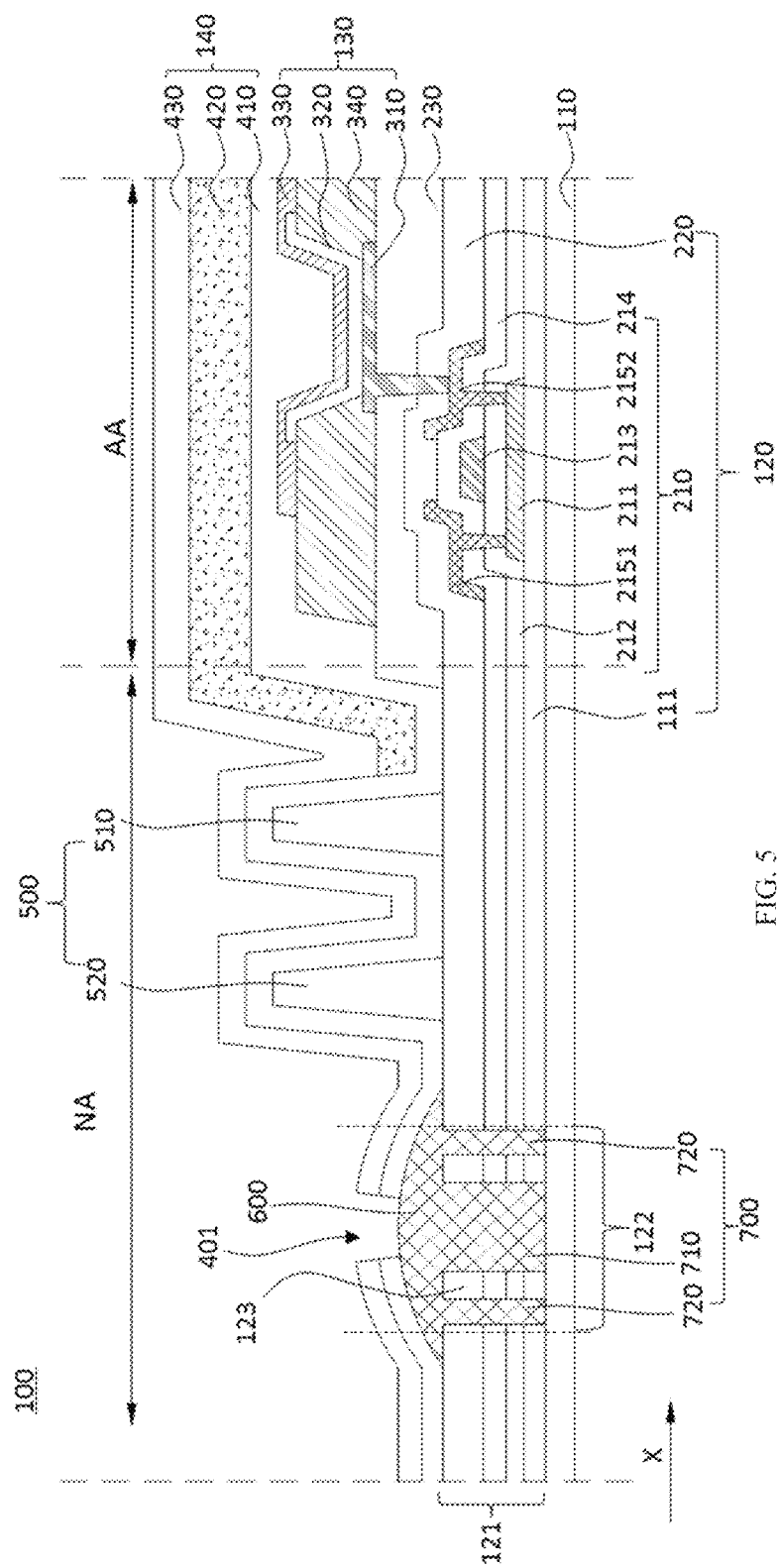
FIG. 5 is a cross-sectional view taken along A-A of FIG. 4.

FIG. 4 is a schematic diagram of a display panel according to another embodiment of the present disclosure, and FIG. 5 is a cross-sectional view taken along a direction A-A of FIG. 4. The same features of the present embodiment are not repeated here.

The present embodiment is different in that the first inorganic insulating layer 121 further includes a plurality of first protrusions 123 located in the first recess 122. The first protrusions 123 are located in the same layer as the first inorganic insulating layer 121, and the organic auxiliary layer covers the first protrusions.

In this way, the first protrusions reinforce a bonding force between the organic auxiliary layer and the first inorganic insulating layer to avoid film separation during formation of the first opening. Additionally, the crack can be further blocked by the first protrusions.

In the present embodiment, for example, two first protrusions are provided for illustration. However, in other embodiments of the present disclosure, a number of the first protrusions is not limited to two.

Further, the organic auxiliary layer 600 covers and contacts the first protrusions 123. The first protrusions 123 are spaced from each other with a gap 700, and one of the first protrusions 123 is spaced from a sidewall of the first recess 122 with a gap 700, and the organic auxiliary layer 600 fills the gap 700.

The gaps 700 include at least one first gap 710 and at least one second gap 720. The first gap 710 is larger than the second gap 720, and the first opening 401 is located on the part of the organic auxiliary layer 600 in the first gap 710.

It should be noted that, in the above embodiment, the dimensions or widths of the gaps to be compared are those in the first direction X, or in the direction from the display area to the edge of the display panel.

In this way, the bonding force between the organic auxiliary layer and the first inorganic insulating layer is improved while further preventing the crack from spreading to the array layer. In addition, by the arrangement of different gaps, it is guaranteed that the first opening is formed at an accurate position while the first gap is assisted by the second gap.

In an embodiment, the dimension of the first gap 710 may be 2 μm to 8 μm larger than the dimension of the second gap 720. The inventors have found through experiments that when the dimensions of the first gap and the second gap satisfy the above requirement, it can be ensured that the first opening is formed accurately on the part of the organic auxiliary layer in the first gap, so that the first gap can play an assisting function, and also prevent the inorganic encapsulating layer from fracturing or cracking at the second gap at the same time, thereby ensuring the integrity of the first opening edge and avoiding severe burrs or jagged edges.

In an embodiment, the first recess 122 has a width ranging from 3 μm to 10 μm. Since the organic light-emitting device is more sensitive to temperature, a change of the ambient temperature during the manufacturing process of the display panel is limited. The inventors have found that, when the width of the first recess ranges from 3 μm to 10 μm, a difference in thermal expansion and contraction between the inorganic encapsulating layer and the organic auxiliary layer is sufficient to form the first opening 401 in the inorganic encapsulating layer within a tolerable range of temperature change of the display panel.

In an embodiment, the width of the first gap is 5 μm, which can ensure both a narrow frame and a good yield. That is, the first gap does not occupy too much area at the frame of the display panel, and the first opening is ensured to be formed above the part of the organic auxiliary layer in the first gap. Within such a range, the integrity of the edge of the first opening is ensured, and severe burrs or jagged edges are avoided.

In an embodiment, in the first direction X, at least two second gaps 720 are located on two sides of the first gap 710. In this way, on the one hand, the first opening can be accurately positioned on the organic auxiliary layer, and the second gaps can have a buffering function. It can be understood that, in the process of forming the first opening, the part of the organic auxiliary layer in the first gap has the largest degree of deformation, and the second gaps disposed between the first gap and the sidewall of the first recess provide certain buffering effect and a structural stability.

In an embodiment, the retaining wall 500 includes a first dam 510 and a second dam 520. The first dam 510 is disposed around the display area AA, and the second dam 520 is spaced apart from and surrounds the first dam 510. The thin film encapsulation layer 140 covers the first dam 510 and is located in a region surrounded by the second dam 520. The first organic encapsulation layer 420 is located in a region surrounded by the first dam 510, and the first dam 510 prevents the organic material in the thin film encapsulation layer 140 from overflowing.

In an embodiment, the first recess 122 surrounds the display area AA, and the first protrusions have the same extending path as the first recess 122, i.e., surrounding the display area AA, and the plurality of first protrusions 123 is sequentially arranged along a direction from the display area AA towards the non-display area NA. That is, all orthographic projections of the first recess, the first protrusions, and the gaps on the substrate are closed loops surrounding the display area; and one first protrusion close to the edge of the display panel surrounds one first protrusion close to the display area. In this way, the display panel is structured consistently on all sides, thereby avoiding stress concentration at some positions, and avoiding crack spreading to all directions.

Further referring to FIG. 5, the substrate 110 is made of an organic material, the first recess 122 exposes the substrate 110, and the organic auxiliary layer 600 is in contact with the substrate 110.

In the above embodiment, since both the organic auxiliary layer and the substrate are made of organic materials, their degrees of thermal expansion or contraction tend to be identical. Further, the first protrusions provided in the first recess are independent of each other in a transverse direction, and the first protrusions directly contact the substrate, so that the first protrusions can directly move with the contraction or expansion of the substrate. Therefore, when the ambient temperature of the display panel changes, a side of the organic auxiliary layer facing towards the substrate is not limited by other layers such that a change degree of thermal expansion or contraction of the organic auxiliary layer differs from that of the inorganic encapsulation layer. The organic auxiliary layer cooperates with the substrate in such a manner that the first protrusions and the two sides of the first recess move with the thermal expansion and contraction of the substrate so as to facilitate the thermal expansion and contraction of the organic auxiliary layer. Thus, the inorganic encapsulation layer located on and contacting the first inorganic insulating layer on both sides of the first recess is subjected to a force generated by a relative movement transmitted from the substrate, which is conducive to forming a first opening faster at a smaller temperature difference, avoiding an excessive temperature difference that may affect the display panel. In addition, with the above-described design, the thermal expansion and contraction of the organic auxiliary layer have no influence on other layers, for example, the first inorganic insulating layer will not be expanded and components in the array layer of the display panel will not be affected.

Further, the organic auxiliary layer may be in direct contact with the substrate made of an organic material, i.e., the first recess may completely penetrate through the first inorganic insulating layer. In this way, the crack spreading to a thickness direction of the display panel can be completely prevented, and the organic auxiliary layer has better contact with the substrate that is also made of an organic material, thereby improving the bonding force between the film layers in the edge region, and avoiding cracking of the film layers at the edge.

Figure 6:
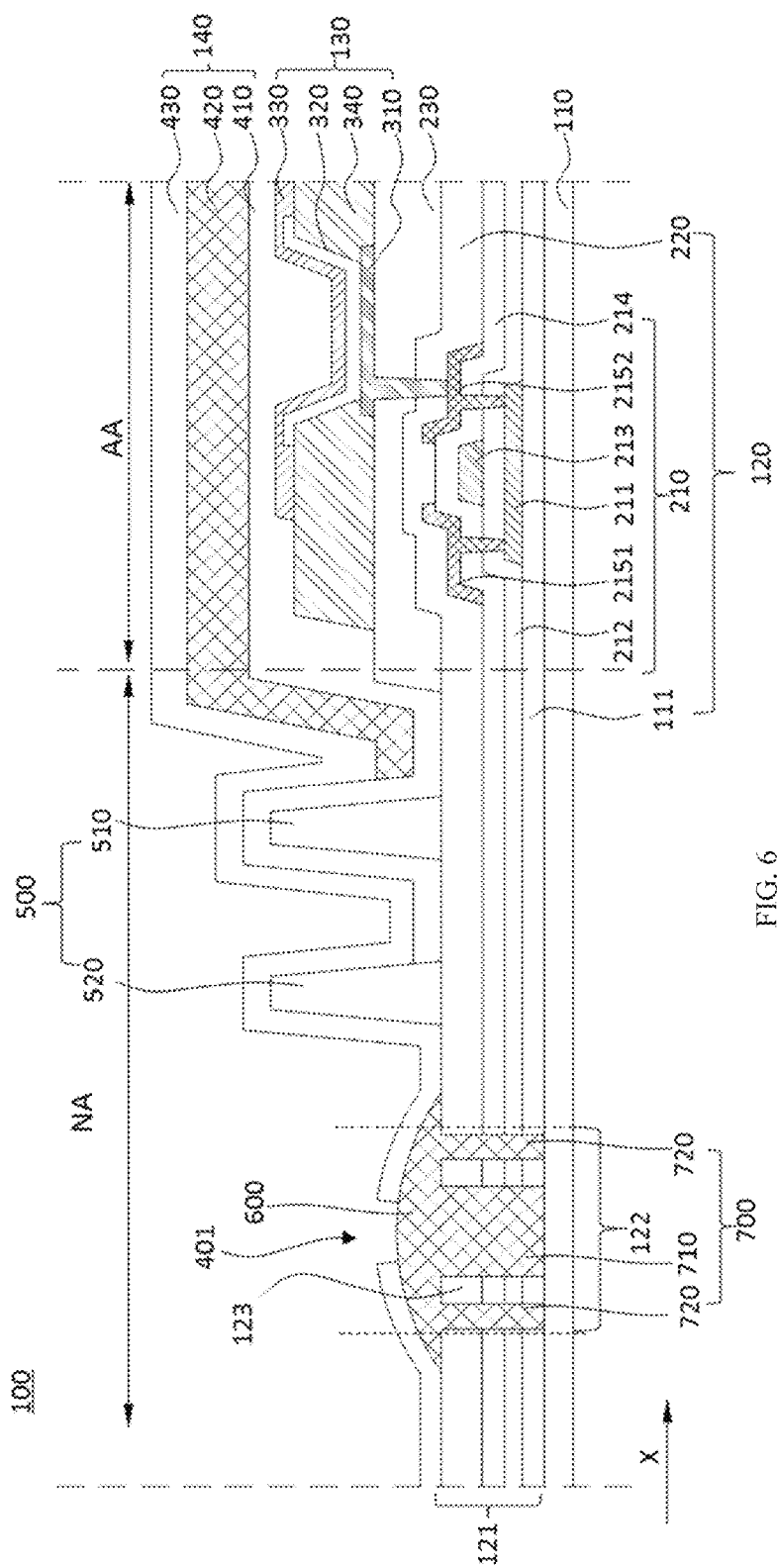
FIG. 6 is another cross-sectional view of the display panel taken along A-A of FIG. 4 according to an embodiment of the present disclosure.

FIG. 6 is another cross-sectional view of the display panel taken along the direction A-A of FIG. 4, according to an embodiment of the present disclosure.

In this embodiment, the first inorganic encapsulation layer 410 and the second inorganic encapsulation layer 430 cover the display area AA and extend from the display area AA to the non-display area NA, the first inorganic encapsulation layer 410 stops at the second dam 520, and the second inorganic encapsulation layer 430 covers the second dam 520 and extends to the cutting edge of the display panel 100. The second inorganic encapsulation layer 430 covers the first recess 122, and the second inorganic encapsulation layer 430 is in contact with the organic auxiliary layer 600 in the first recess 122. Further, the second inorganic encapsulation layer 430 includes a first opening 401 penetrating through the second inorganic encapsulation layer 430 in the non-display area. The first opening 401 is located on a part of the organic auxiliary layer 600 in the first recess 122.

The organic auxiliary layer 600 may be located in the same layer and may be made of the same material as one or more of the planarization layer 230 and the pixel definition layer 340 disposed between the array layer 120 and the light-emitting function layer 130. In this way, the manufacturing process can be simplified while avoiding introduction of new film materials.

The organic auxiliary layer 600 in this embodiment may also be located in the same layer and made of the same material as the first organic encapsulation layer 420.

Figure 7:
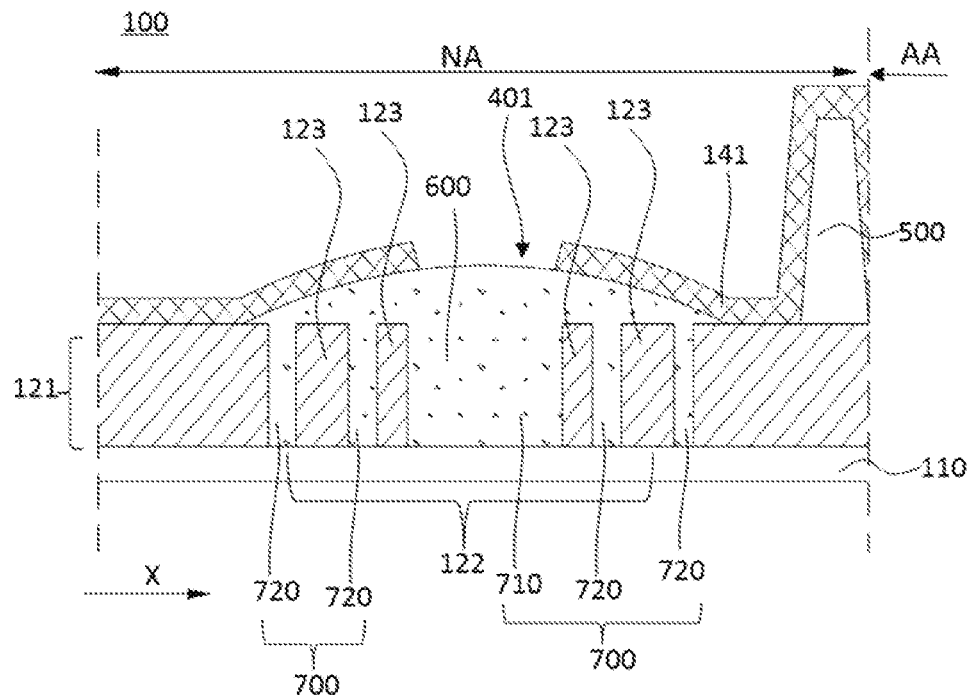
FIG. 7 is a schematic diagram of a display panel according to another embodiment of the present disclosure.

FIG. 7 is a schematic diagram of a display panel according to another embodiment of the present disclosure.

Widths of the first protrusions 123 may gradually increase along a direction from the first gap 710 to each of two sides of the first recess 122. The first opening 401 formed by the inorganic encapsulation layer 141 is located on a part of the organic auxiliary layer 600 filled between two adjacent first protrusions 123 having the smallest widths.

It should be noted that, in this embodiment, the two sides of the first recess are two opposite sides in a first direction X, and the first direction X is parallel to a direction from the display area AA towards the non-display area NA, i.e., a direction perpendicular to an extending direction of an orthographic projection of the first recess 122 on the substrate. The above-described dimensions are the widths in the first direction X.

Through this embodiment, the first protrusions having different widths can play a transition role and prevent the first inorganic insulating layer from being affected by the thermal expansion and contraction of the organic auxiliary layer, for example, preventing the first auxiliary layer from squeezing the first recess after the organic auxiliary layer is expanded, thereby avoiding squeezing components in the first inorganic insulating layer.

Figure 8:
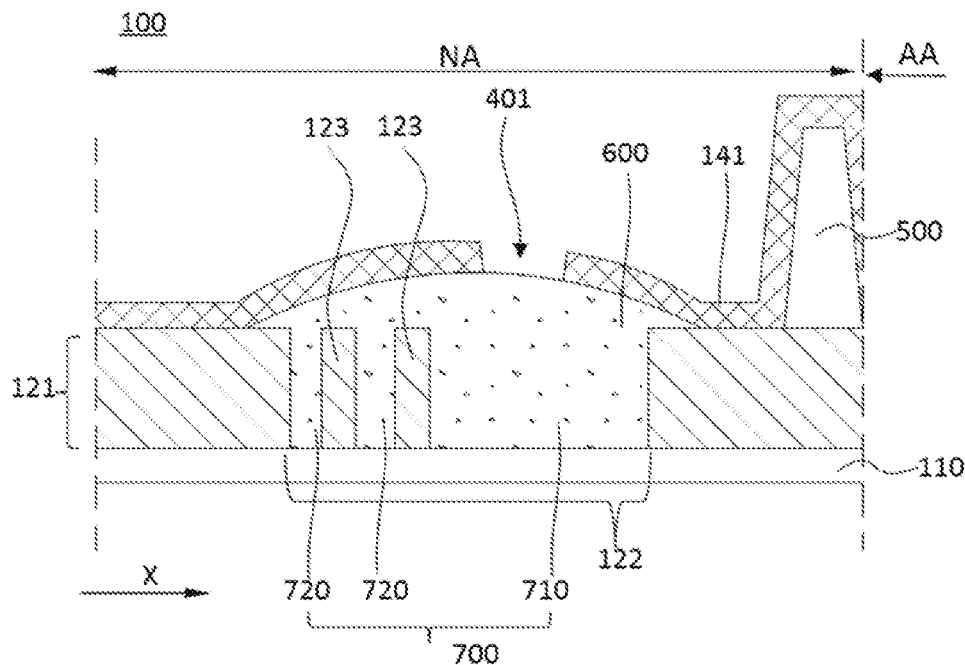
FIG. 8 is a schematic diagram of a display panel according to another embodiment of the present disclosure.

FIG. 8 is a schematic diagram of a display panel according to another embodiment of the present disclosure.

A distance from a first gap 710 to a sidewall of the first recess 122 close to the display area AA is smaller than a distance from the at least one first gap 710 to a sidewall of the first recess 122 close to the non-display area NA.

Further, the first gap 710 is a gap between one of the first protrusions 123 and the sidewall of the first recess 122 close to the display area AA. The second gap 720 is located on a side of the first gap 710 away from the display area AA. That is, the first gap 710 surrounds the display area AA, and the second gap 720 surrounds the first gap 710 and the display area AA.

The first opening may be located at a side of a center of the first recess close to the display area. The center of the first recess is a geometric center of the first recess, which can be a central axis extending along the extending direction of the first recess.

With the present embodiment, the first protrusions are arranged to form multiple barriers for blocking the crack in such a manner that the spreading of the crack is interrupted during passing through the layers of different materials, and finally intercepted by the film layers. Further, a side edge of the first opening facing towards the display area is a stop edge of the film layers that play an actual encapsulation role. Therefore, in this embodiment, the stop edge of the film layers that play the actual encapsulation function is far away from the edge of the display panel so as to be less affected by stress, without proving a broader frame. It is also possible to intercept the crack as much as possible in a spreading direction of the crack (i.e., the first direction X) before the crack reaches the first opening.

Figure 9:
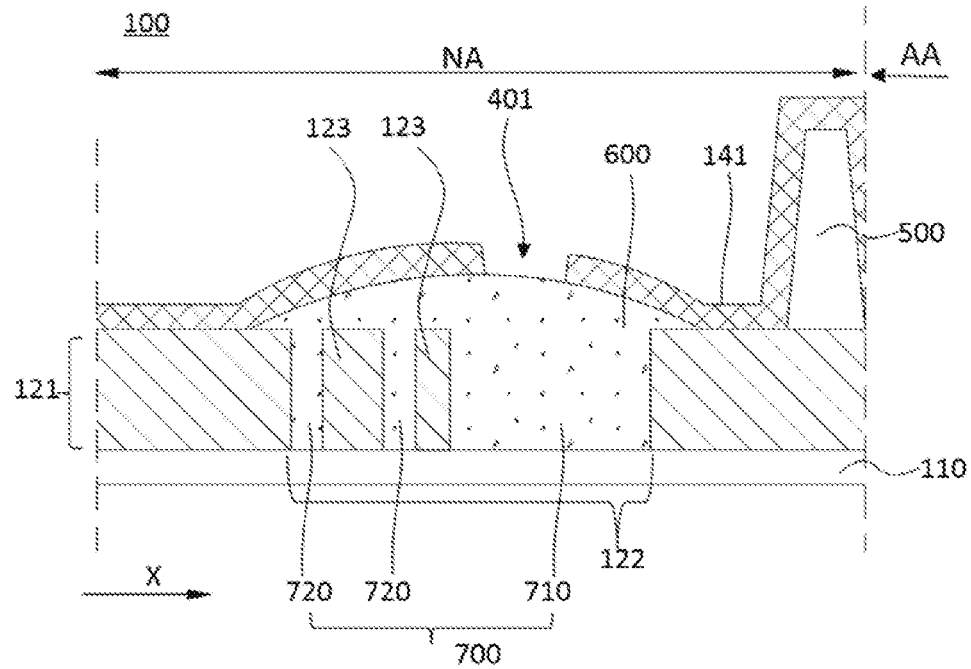
FIG. 9 is a schematic diagram of a display panel according to another embodiment of the present disclosure.

FIG. 9 is a schematic diagram of a display panel according to another embodiment of the present disclosure.

The first gap 710 is a gap between one of the first protrusions 123 and a sidewall of the first recess 122 close to the display area AA. The second gap 720 is located on a side of the first gap 710 facing away from the display area AA. In a direction from the first gap 710 to each of the two sides of the first recess 122, the widths of the first protrusions 123 gradually increase. That is, the widths of the plurality of first protrusions 123 arranged in the direction from the display area AA towards the edge of the display panel 100 gradually increase. A width of one of the first protrusions 123 close to the display area AA in the first direction X is smaller than a width of another one of the first protrusions 123 close to the edge of the display panel 100 in the first direction X.

Figure 10:
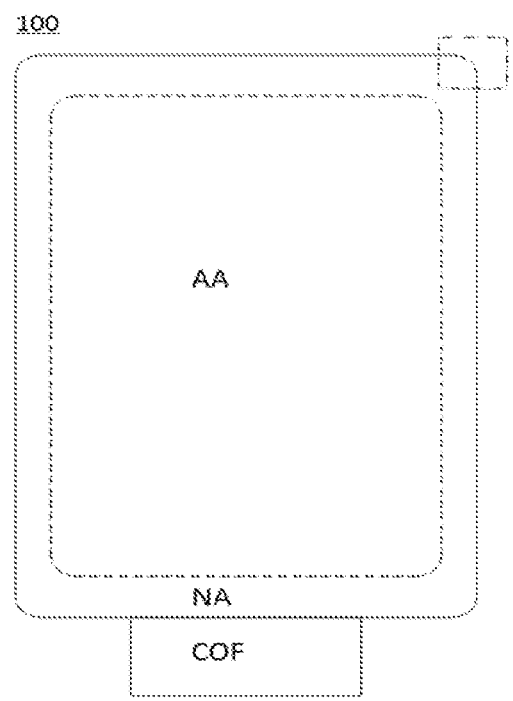
FIG. 10 is a schematic diagram of a display panel according to another embodiment of the present disclosure.
Figure 11:
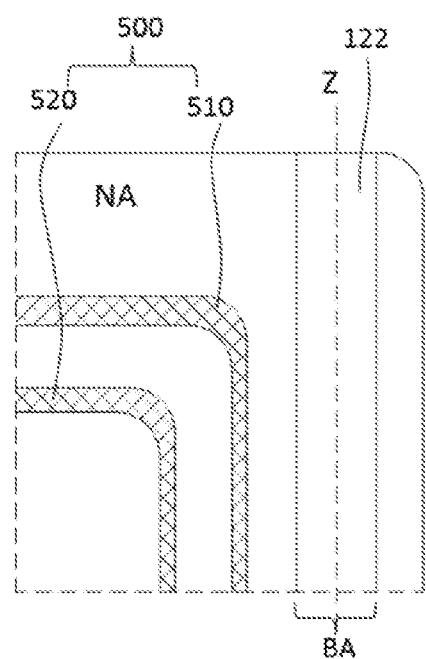
FIG. 11 is a partially enlarged view of a dotted line box of FIG. 10.

FIG. 10 is a schematic diagram of a display panel according to another embodiment of the present disclosure, and FIG. 11 is a partially enlarged view of the dotted line box of FIG. 10.

The first recess 122 can have a strip shape extending along an edge of the display panel 100 adjacent thereto, and the first protrusions 123 extend along the first recess 122.

At least one end of the first recess 122 may extend to a cutting edge of the display panel 100.

In this embodiment, at least one end of the first recess extends to the cutting edge of the display panel. The cutting edge may have some jagged edges (or burrs) or small cracks, and stress concentration may occur at the jagged edges or cracks when the jagged edges or cracks are bent or subjected to force, which provides a guiding path for the formation of the first opening during the thermal expansion, cold contraction, or bending, and also avoids a situation in which the thermal expansion, cold contraction or bending cannot reach an initial cracking strength for forming the first opening. In the meantime, difficulty of the process is not increased, and the existing cutting defect is transformed into a structure assisting structure in forming the first opening.

Further referring to FIG. 10 and FIG. 11, the substrate 110 can be a flexible substrate made of polymer, such as polyimide with a small thickness.

The display panel 100 may include at least one first bending zone BA, and a bending axis Z of each first bending zone BA extends along the first recess 122. That is, the first bending zone BA extends along the first recess 122. In other words, the first recess can be bent along a bending line in a direction parallel to the edge of the display panel.

In an embodiment, the inorganic encapsulating layer has a greater hardness than the organic auxiliary layer. In an embodiment, the first opening extends along the bending line. One end of the first opening is located at the cutting edge.

In an embodiment, the organic auxiliary layer covers a boundary between the first bending zone and a non-bending zone; and optionally, an orthographic projection of the first bending zone on the substrate is located in the orthographic projection of the first recess on the substrate. In this way, the separation of film layers caused by the bending operation can be avoided during the formation of the first opening.

According to this embodiment, since the inorganic encapsulation layer and the organic auxiliary layer have different flexibilities and different degrees of bending resistance, the first opening can be formed by bending, so as to prevent cracks from spreading in the display panel; and the direction and position of the bending axis are easily controlled, and thus a direction of the bending stress can be accurately controlled to ensure an extending direction of the first opening.

Figure 12:
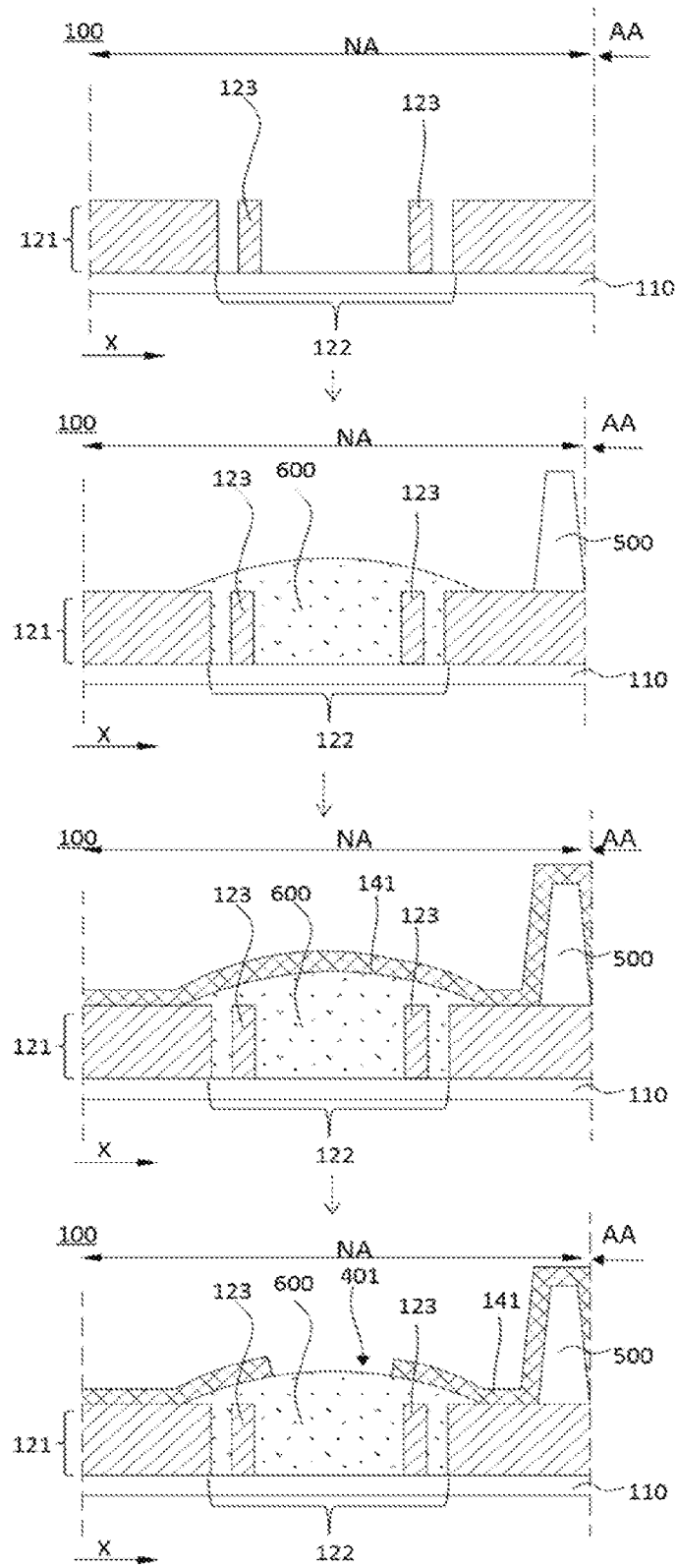
FIG. 12 is a schematic diagram of a method of manufacturing a display panel according to an embodiment of the present disclosure.

FIG. 12 is a schematic diagram of a manufacturing method of a display panel according to an embodiment of the present disclosure. The above-described display panel can be manufactured by the manufacturing method. In the manufacturing method or in the manufactured display panel, a display area and a non-display area are pre-divided.

The manufacturing method includes: providing a substrate 110; and manufacturing an array layer 120 on one side of the substrate 110. The step of manufacturing an array layer 120 includes: manufacturing a first inorganic insulating layer 121, the first inorganic insulating layer 121 including at least one first recess 122 located in the non-display area NA. In an embodiment, the first recess 122 may be formed by etching.

The manufacturing method further includes a step of manufacturing a light-emitting function layer 130 on a side of the array layer 120 facing away from the substrate 110.

After the first inorganic insulating layer 121 is manufactured, the organic auxiliary layer 600 is manufactured by filling the organic auxiliary layer 600 in the first recess 122.

In an embodiment, the organic auxiliary layer 600 is manufactured before a step of manufacturing a thin film encapsulation layer 140, and the organic auxiliary layer 600 and the film layer of an organic material in the light-emitting function layer 130 are formed in the same layer and by the same material.

The thin film encapsulation layer 140 is manufactured on a side of the light-emitting function layer 130 facing away from the substrate 110.

The step of manufacturing the thin film encapsulation layer 140 includes: manufacturing at least one inorganic encapsulation layer 141 with an inorganic material. The organic auxiliary layer 600 is formed at least before the at least one inorganic encapsulation layers 141, and the at least one inorganic encapsulation layer 141 covers the display area AA and extends to contact and cover the part of the organic auxiliary layer 600 in the first recess 122.

In an embodiment, after the at least one inorganic encapsulation layer 141 is formed, a first opening 401 penetrating through the inorganic encapsulation layers 141 is formed in the inorganic encapsulation layer 141. The first opening 401 is located on the organic auxiliary layer 600 in the first recess 122.

In the present embodiment, by providing the first recess and filling the first recess with the organic material, on the one hand, a crack introduced from the cutting edge can be prevented from spreading to the display area by the first recess, and the organic auxiliary layer can also block the crack while relieving the stress; on the other hand, by combining the above design with the thin film encapsulation layer, the film layer contacting the lower side of the film encapsulation layer may vary from an inorganic material to an organic material then to another inorganic material along the spreading direction of the crack (i.e., the direction from the edge of the display panel towards the display area). Since the CTE values of the first inorganic insulating layer and the inorganic encapsulating layer are different from the CTE value of the organic auxiliary layer, and the expansion ratios of the inorganic encapsulating layer and the first inorganic insulating layer are different from the expansion ratio of the organic auxiliary layer, as a result different degrees of thermal expansion and contraction may occur under the same temperature change. Therefore, the inorganic encapsulation layer is formed with an opening facing the organic auxiliary layer in the first recess, i.e., the first opening. It should be understood that, as the temperature may change during subsequent manufacturing processes such as curing, laser removal, etc., the first opening can be formed in the above structure without any additional manufacturing process.

Moreover, the crack at the edge of the display panel can be prevented from spreading to the display area by the first opening. In the meantime, since an edge of the opening of the inorganic encapsulation layer is located on the organic auxiliary layer, the stress of the edge can be alleviated by the organic material, which not only prevents the spreading of the crack at the edge of the display panel but also reduces the risk of cracking in non-edge areas of the display panel. In addition, the organic auxiliary layer is received in the first recess, avoiding an increase in the film thickness.

Figure 13:
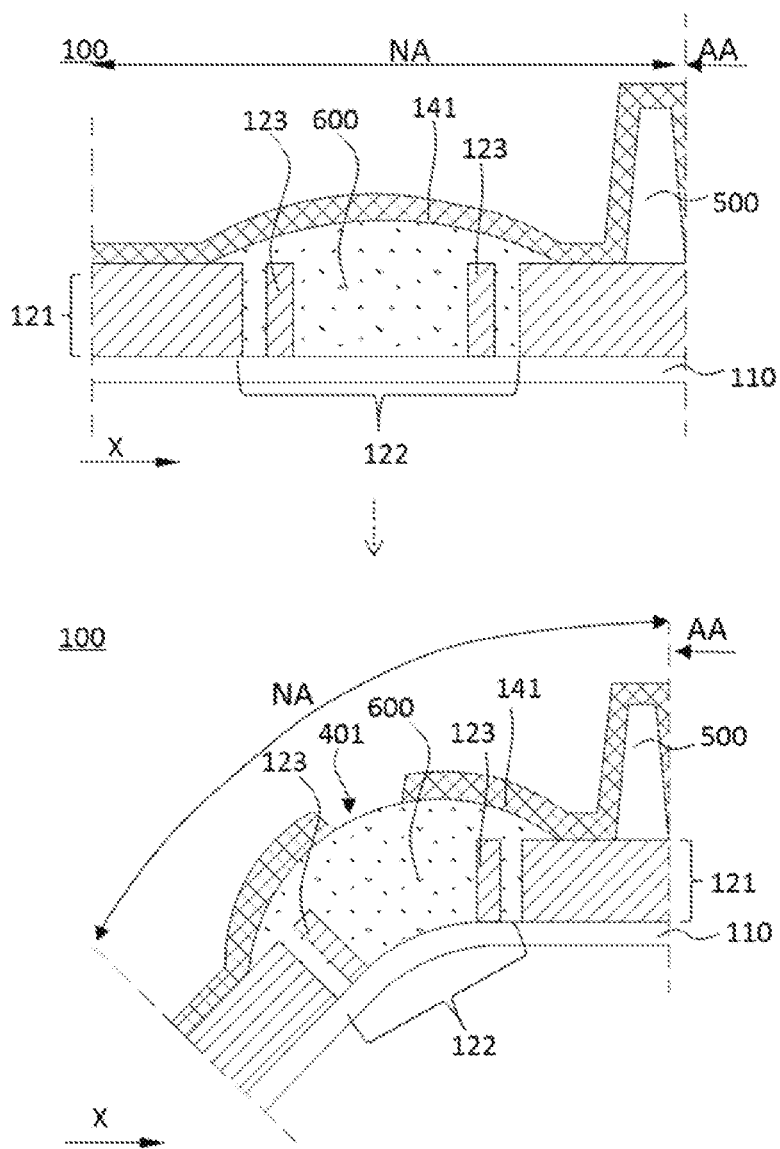
FIG. 13 is a schematic diagram of a method of manufacturing a display panel according to another embodiment of the present disclosure.

FIG. 13 is a schematic diagram of another manufacturing method of a display panel according to an embodiment of the present disclosure.

The present embodiment differs from the above embodiment in that, the organic auxiliary layer 600 has a smaller hardness than the inorganic encapsulating layer 141; or the organic auxiliary layer 600 has a greater elasticity than the inorganic encapsulating layer 141. The organic auxiliary layer 600 may be obtained by solidifying a flexible material or a material having a strong fluidity.

In an embodiment, the display panel 100 includes at least one first bending zone BA, and a bending axis Z of each of the at least one first bending zone BA extends along the first recess 122. That is, each of the at least one first bending zone BA extends along the first recess 122. In other words, the first recess can be bent along a bending line in a direction parallel to an edge of the display panel. An extending direction of the first recess is substantially identical to or parallel to an edge of the display panel adjacent thereto.

In an embodiment, the step of forming the first opening 401 penetrating through the inorganic encapsulation layer 141 in the inorganic encapsulation layer 141 includes: bending the display panel 100 along the first recess 122 (the display panel herein may be a display panel to be further processed or a final product) to form the first opening 401 in the inorganic encapsulation layer 141.

In an embodiment, a bending direction for bending the display panel is a direction from the substrate away from the inorganic encapsulation layer.

It should be noted that the display panel can be repeatedly bent between two states, i.e., with different bending curvatures, for example, a flat state and a bent state.

In the present embodiment, since the inorganic encapsulation layer and the organic auxiliary layer have different flexibilities and different degrees of bending resistance, the first opening can be formed by bending, so as to prevent cracks from spreading into the display panel; and the direction and position of the bending axis are easily controlled so that a direction of the bending stress can be accurately controlled to ensure the direction in which the first opening extends.

In the present embodiment, the first bending zone can use a re-bending frame of the display panel to realize the bending zone of a narrow frame. In this way, the space occupied by the first recess and the first opening can be reduced, a bending path can be provided for the bending, and the first opening can be formed in the existing bending step during the manufacturing process, which is conducive to a standardization of the first opening, thereby preventing the inorganic encapsulation layer from generating a crack that is irregular or parallel to the first direction during the bending process.

Figure 14:
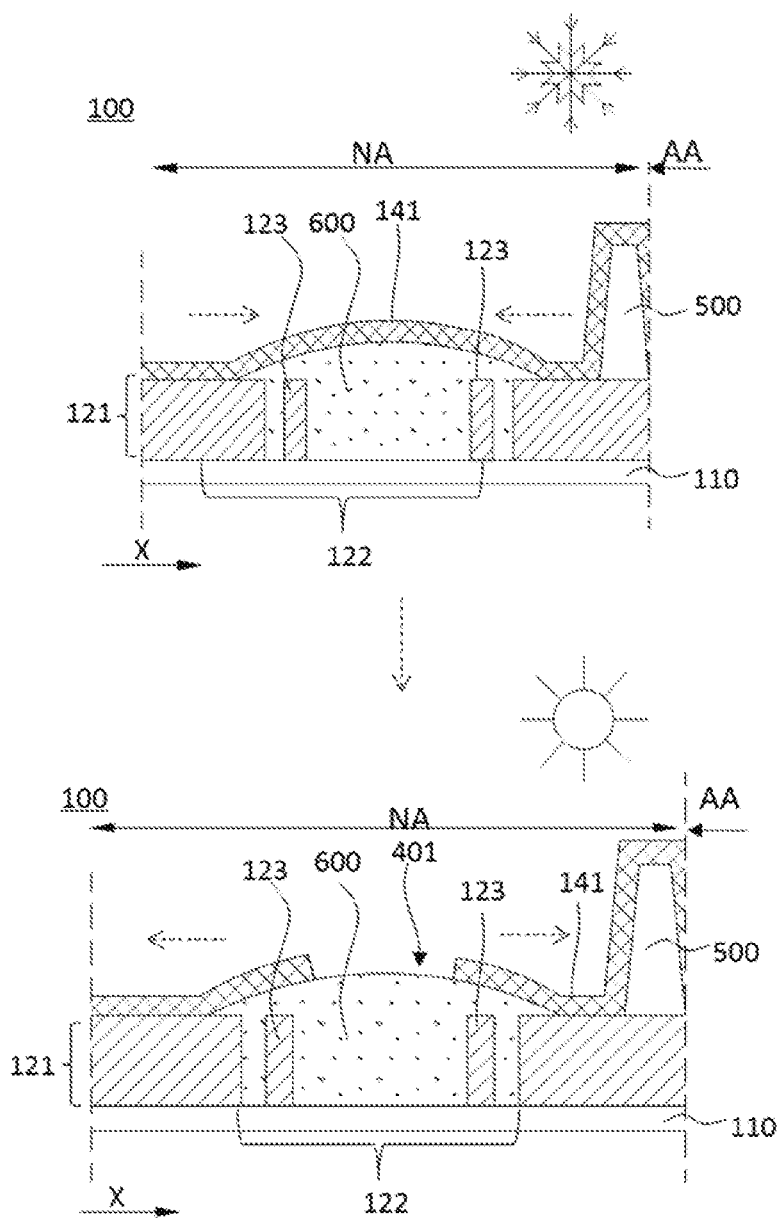
FIG. 14 is a schematic diagram of a method of manufacturing a display panel according to yet another embodiment of the present disclosure.

FIG. 14 is a schematic diagram of still another manufacturing method of a display panel according to an embodiment of the present disclosure.

In an embodiment, the inorganic encapsulation layer and the organic auxiliary layer have different CTE values, and the inorganic encapsulation layer and the first inorganic insulating layer have different thermal expansion ratios from the organic auxiliary layer.

In an embodiment, the step of forming the first opening 401 penetrating through the inorganic encapsulation layer 141 in the at least one inorganic encapsulation layer 141 includes: changing the temperature of the display panel 100 until the inorganic encapsulating layer 141 and the organic auxiliary layer 600 thermally expand or contract to form the first opening 401 in the inorganic encapsulating layer 141.

In an embodiment, the temperature of the display panel 100 is first set to a second temperature such that the inorganic encapsulation layer 141 and the organic auxiliary layer 600 are cooled to contract, and then the temperature of the display panel 100 is set to a first temperature, where the second temperature is lower than the first temperature. The inorganic encapsulating layer 141 and the organic auxiliary layer 600 have different degrees of thermal expansion, the organic auxiliary layer 600 has a greater degree of expansion and has better elasticity and stretching property, while the inorganic encapsulation layer 141 has poor elasticity and greater hardness. In this regard, the organic auxiliary layer 600 pulls the inorganic encapsulating layer 141 to form the first opening 401 in the inorganic encapsulating layer 141.

It is also possible to change the order of the first temperature and the second temperature. For example, the temperature of the display panel 100 is first set to the first temperature such that the inorganic encapsulation layer 141 and the organic auxiliary layer 600 are heated to expand, and then the temperature of the display panel 100 is set to the second temperature, where the second temperature is lower than the first temperature. The inorganic encapsulating layer 141 and the organic auxiliary layer 600 have different degrees of cold contraction, the organic auxiliary layer 600 has a greater degree of contraction, and thus the organic auxiliary layer 600 together with the inorganic encapsulating layer 141 will contract. Further, the inorganic encapsulating layer 141 has a greater hardness, and thus can be pulled by the organic auxiliary layer 600 to form the first opening 401.

In the existing manufacturing process, the respective steps require different temperatures to satisfy requirements of different processes. In this way, the change of the temperature of the display panel 100 can be achieved by switching of the existing processes performed after the formation of the inorganic encapsulation layer. Therefore, with the present embodiment, the first opening for preventing the cracks can be effectively formed without affecting other structures and increasing the number of process steps.

It can be understood that the present disclosure only illustrates one first opening and the manufacturing of one first opening, but the present disclosure is not limited thereto. A plurality of first opening can be provided as needed. Further, the plurality of first openings may be arranged in a similar manner as the above-described gaps, i.e., like nesting rings.

Figure 15:
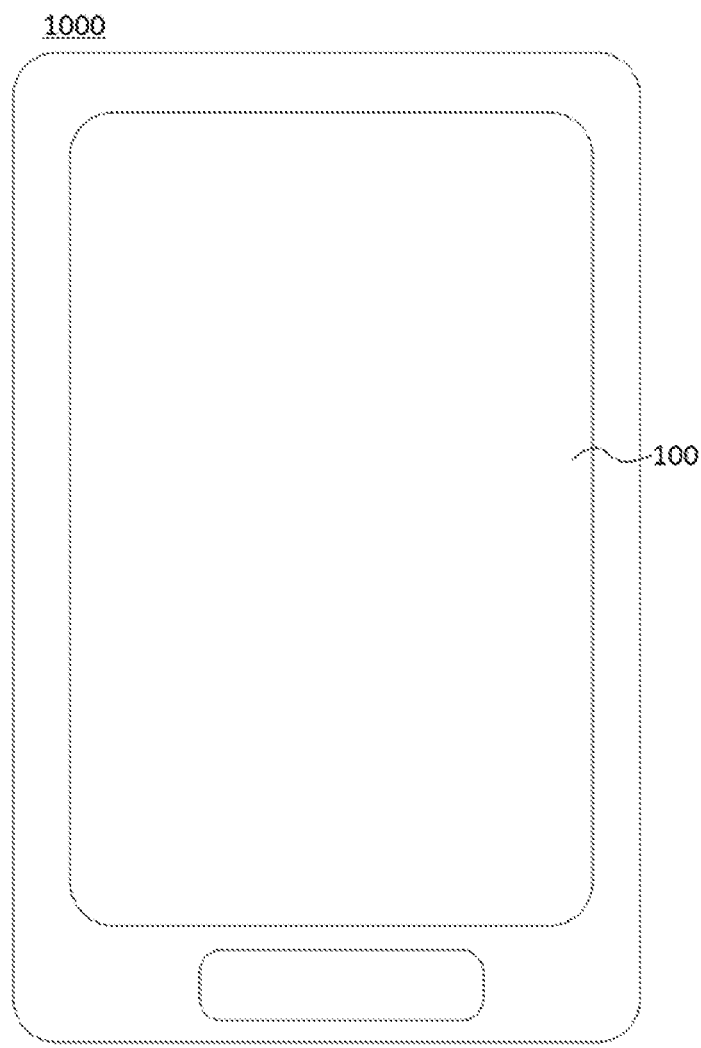
FIG. 15 is a schematic structural diagram of a display apparatus according to an embodiment of the present disclosure.

The present disclosure also provides a display apparatus including the display panel provided by the present disclosure. FIG. 15 is a structural schematic diagram of a display apparatus according to an embodiment of the present disclosure. The display device 1000 includes the display panel 100 provided by any of the above embodiments of the present disclosure. In the embodiment of FIG. 15, for example, the display apparatus 1000 is embodied as a mobile phone. It can be understood that the display apparatus provided by the embodiment of the present disclosure may be a display apparatus having a display function, such as a computer, a television, an in-vehicle display apparatus, and the like, which is not specifically limited thereto. The display apparatus provided by the embodiment of the present disclosure also has the beneficial effects of the display panel provided by the embodiments of the present disclosure, the details of which can be referred to the detailed description regarding the display panel in the foregoing embodiments, and are not described herein again.

The above is a further detailed description of the present disclosure in connection with the embodiments, but the present disclosure are not limited to these embodiments. Any simple deductions or replacements made by those skilled in the art without departing from the invention concept of the present disclosure shall fall within the protection scope of the present disclosure.

What is claimed is:

1. A display panel having a display area and a non-display area surrounding the display area, the display panel comprising:
   a substrate;
   an array layer located on the substrate, wherein the array layer comprises a first inorganic insulating layer, and wherein the first inorganic insulating layer comprises a first recess located in the non-display area;
   a light-emitting function layer located on the array layer;
   a thin film encapsulation layer located on the light-emitting function layer; and
   an organic auxiliary layer filled in the first recess,
   wherein the thin film encapsulation layer comprises at least one inorganic encapsulation layer covering the display area and extending to contact and cover the organic auxiliary layer in the first recess,
   wherein the at least one inorganic encapsulation layer comprises a first opening penetrating through the at least one inorganic encapsulation layer, and the first opening is located on the organic auxiliary layer in the first recess, and
   wherein an orthographic projection of the first opening on the substrate overlaps an orthographic projection of the first recess on the substrate.

2. The display panel according to claim 1, wherein the substrate is made of an organic material, the first recess exposes the substrate, and the organic auxiliary layer is in contact with the substrate.

3. The display panel according to claim 1, wherein the first inorganic insulating layer further comprises a plurality of first protrusions located in the first recess, the plurality of first protrusions and the first inorganic insulating layer are made of a same material and in a same layer, and the organic auxiliary layer covers the plurality of first protrusions.

4. The display panel according to claim 3, wherein the organic auxiliary layer is filled in gaps between the plurality of first protrusions; and the gaps comprise a first gap and a second gap, the first gap is larger than the second gap, and the first opening is located on a part of the organic auxiliary layer filled in the first gap.

5. The display panel according to claim 4, wherein a dimension of the first gap is 2 μm to 8 μm larger than a dimension of the second gap.

6. The display panel according to claim 4, wherein a dimension of the first gap is in a range of 3 μm to 10 μm.

7. The display panel according to claim 4, wherein widths of the plurality of first protrusions gradually increase in a direction from the first gap to each of two sides of the first recess.

8. The display panel according to claim 4, wherein a distance from the first gap to a sidewall that is proximate to the display area of the first recess is smaller than a distance from the first gap to a sidewall of the first recess that is proximate to the non-display area.

9. The display panel according to claim 3, wherein the first recess surrounds the display area, the plurality of first protrusions surrounds the display area, and the plurality of first protrusions is sequentially arranged along a direction from the display area towards the non-display area.

10. The display panel according to claim 3, wherein the first recess has a strip shape extending along an edge of the display panel adjacent thereto, and each of the plurality of first protrusions extends along the at least one recess.

11. The display panel according to claim 10, wherein at least one end of the first recess extends to a cutting edge of the display panel.

12. The display panel according to claim 1, wherein the array layer comprises a buffer layer, an active layer, a gate insulating layer, a gate metal layer, an interlayer insulating layer, and a source-drain metal layer that are stacked; and wherein the first inorganic insulating layer is selected from the group consisting of the buffer layer, the gate insulating layer, the interlayer insulating layer, and combinations thereof.

13. The display panel according to claim 12, further comprising a planarization layer located between the array layer and the light-emitting function layer, wherein the light-emitting function layer further comprises a pixel definition layer, and the organic auxiliary layer is made of a same material and in a same layer as the planarization layer and/or the pixel definition layer.

14. The display panel according to claim 1, wherein the display panel has at least one first bending zone, and wherein a bending axis of the at least one first bending zone extends along the orthographic projection of the first recess on the substrate.

15. A display apparatus comprising a display panel, the display panel having a display area and a non-display area surrounding the display area, the display panel comprising:

a substrate;

an array layer located on the substrate, wherein the array layer comprises a first inorganic insulating layer, and wherein the first inorganic insulating layer comprises a first recess located in the non-display area;

a light-emitting function layer located on the array layer;

a thin film encapsulation layer located on the light-emitting function layer; and an organic auxiliary layer filled in the first recess, wherein the thin film encapsulation layer comprises at least one inorganic encapsulation layer covering the display area and extending to contact and cover the organic auxiliary layer in the first recess, wherein the at least one inorganic encapsulation layer comprises a first opening penetrating through the at least one inorganic encapsulation layer, and the first opening is located on the organic auxiliary layer in the first recess, and wherein an orthographic projection of the first opening on the substrate overlaps an orthographic projection of the first recess on the substrate.

16. A method of manufacturing a display panel, the display panel having a display area and a non-display area surrounding the display area, the method comprising:

providing a substrate;

manufacturing an array layer on one side of the substrate, wherein said manufacturing the array layer comprises manufacturing a first inorganic insulating layer, the first inorganic insulating layer comprising a first recess in the non-display area;

manufacturing a light-emitting function layer on a side of the array layer facing away from the substrate;

manufacturing a thin film encapsulation layer on a side of the light-emitting function layer facing away from the substrate;

manufacturing an organic auxiliary layer after the first inorganic insulating layer is manufactured, the organic auxiliary layer being filled in the first recess, wherein said manufacturing of the thin film encapsulation layer comprises: manufacturing at least one inorganic encapsulation layer covering the display area and extending to contact and cover the organic auxiliary layer in the at least one first recess; and forming, in the at least one inorganic encapsulation layer, a first opening penetrating through the at least one inorganic encapsulation layer, wherein the first opening is located on the organic auxiliary layer in the first recess, and an orthographic projection of the first opening on the substrate overlaps an orthographic projection of the first recess on the substrate.

17. The method of manufacturing a display panel according to claim 16, wherein the organic auxiliary layer has a smaller hardness than the at least one inorganic encapsulation layer; and wherein said forming, in the at least one inorganic encapsulation layer, a first opening penetrating the at least one inorganic encapsulation layer comprises: bending the display panel along the first recess to form the first opening in the at least one inorganic encapsulation layer.

18. The method of manufacturing a display panel according to claim 16, wherein said forming, in the at least one inorganic encapsulation layer, a first opening penetrating the at least one inorganic encapsulation layer comprises: changing a temperature of the display panel in such a manner that the at least one inorganic encapsulation layer and the organic auxiliary layer thermally expand or cold contract to form the first opening in the inorganic encapsulating layer.

* * * * *